(12) United States Patent
Nakamura et al.

(10) Patent No.: US 8,153,902 B2
(45) Date of Patent: Apr. 10, 2012

(54) WIRING BOARD AND ELECTRONIC COMPONENT DEVICE

(75) Inventors: Junichi Nakamura, Nagano (JP); Kotaro Kodani, Nagano (KR); Michiro Ogawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 275 days.

(21) Appl. No.: 12/627,096

(22) Filed: Nov. 30, 2009

(65) Prior Publication Data

US 2010/0132993 A1    Jun. 3, 2010

(30) Foreign Application Priority Data

Dec. 2, 2008    (JP) .................................. 2008-307810

(51) Int. Cl.
*H05K 1/00*    (2006.01)
(52) U.S. Cl. ..................... 174/254; 174/255; 174/260
(58) Field of Classification Search .................. None
See application file for complete search history.

(56) References Cited

U.S. PATENT DOCUMENTS

| | | | |
|---|---|---|---|
| 6,507,100 B1 * | 1/2003 | Valluri et al. ................. | 257/697 |
| 6,729,024 B2 * | 5/2004 | Tandy ............................. | 29/847 |
| 7,015,069 B2 * | 3/2006 | Takahashi et al. ............. | 438/114 |
| 7,266,888 B2 * | 9/2007 | Chang et al. .................... | 29/846 |
| 7,594,317 B2 | 9/2009 | Nakamura | |
| 2008/0012140 A1 | 1/2008 | Tsukano | |
| 2009/0137085 A1 | 5/2009 | Tsukano | |

FOREIGN PATENT DOCUMENTS

| | | |
|---|---|---|
| JP | 2005-167141 A1 | 6/2005 |
| JP | 2007-158174 A1 | 6/2007 |
| JP | 2008-21921 A1 | 1/2008 |

* cited by examiner

*Primary Examiner* — Ishwarbhai Patel (74) *Attorney, Agent, or Firm* — Kratz, Quintos & Hanson, LLP (57) ABSTRACT

A wiring board includes a wiring forming region in which a plurality of wiring layers are stacked while sandwiching insulating layers, an outer periphery region which is arranged around the wiring forming region and in which a reinforcing pattern is formed in the same layer as each of the wiring layers. An area ratio of the reinforcing pattern to the outer periphery region and an area ratio of the wiring layer to the wiring forming region are substantially the same in each of the layers, and the reinforcing patterns exist without a gap in the outer periphery region when the wiring board is viewed in planar perspective.

6 Claims, 11 Drawing Sheets

FIG. 9B

WIRING BOARD AND ELECTRONIC COMPONENT DEVICE

CROSS-REFERENCE TO RELATED APPLICATION

This application is based on and claims priority of Japanese Patent Application No. 2008-307810 filed on Dec. 2, 2008, the entire contents of which are incorporated herein by reference.

BACKGROUND OF THE INVENTION

1. Field of the Invention

The present invention relates to a wiring board that is used in mounting electronic components such as semiconductor devices, and an electronic component device.

2. Description of the Related Art

Conventionally, a build-up method has been widely used as a technology to manufacture a wiring board in a multi-layer wiring structure. Various types of wiring boards using the build-up method can be fabricated due to combinations of a material (resin, representatively) of interlayer insulating film and a via hole forming process, and its typical set of manufacturing processes includes forming of insulating layers, forming of via holes in the insulating layers and forming of wiring layers including the inside of the via holes on the both surfaces or one surface of a core board as a supporting base material, and sequentially repeating those steps to build up the layers. Of areas in such a structure, the wiring layers and insulating layers can be formed thin because they are stacked by the build-up method, but the core board requires reasonable thickness to provide the wiring board with rigidity, and thus thin manufacturing of the entire wiring board (semiconductor package) was limited.

Therefore, a structure in which the core board (supporting member) is removed has been recently employed to achieve further thin manufacturing of the wiring board. The wiring board having such structure is also called a "coreless board" which means that the board does not have "core" areas.

As an example of the manufacturing method of such coreless board, a basic process described in Patent Document 1 (Japanese Patent Laid-open No. 2007-158174) will be described. It includes preparing a temporary board as a supporting body, sequentially forming a required number of build-up layers (insulating layers including via holes, wiring layers including the inside of the via holes) in a wiring forming region on the temporary board, afterwards covering the layers with solder resist film, and finally removing an outer periphery region of the wiring forming region by cutting it to remove the temporary board.

Then, it is followed by mounting chips on the coreless board, and afterwards filling underfill resin in gaps between the chips and the coreless board, or covering the entire coreless board with mold resin so as to cover the chips.

As described above, the conventional coreless board (wiring board) has a disadvantage that rigidity of the entire wiring board is small due to no core board, and therefore, "warp" easily occurs in the wiring board.

"Warp" is considered to be caused by a thermal expansion coefficient difference between resin used in an interlayer insulating film or a solder resist layer and a wiring layer, a thermal expansion coefficient difference between semiconductor chips (electronic components) and a wiring board, and furthermore, a thermal expansion coefficient difference between mold resin that covers the entire wiring board after mounting semiconductor chips or underfill resin filled in gaps between semiconductor chips and a wiring board, and be invited by thermal treatment in mounting semiconductor chips, thermal treatment in curing a resin material, or the like.

Then, it was conceived that the rigidity of the entire wiring board was increased by improving an outer periphery region that is a region surrounding the wiring forming region and is removed by cutting it at the time of making finished goods, and forming a dummy pattern (hereinafter, referred to as a "solid dummy pattern") that covers the entire outer periphery region, is made of the same material as the material of the wiring layer, and is disposed in the same layer as the wiring layer.

On the other hand, it is known that only forming the solid dummy pattern in the outer periphery region is insufficient to reduce the warp of wiring board, and occurrence of the warp of wiring board is considerably influenced by a distribution state of the wiring layer in the wiring forming region and that of the dummy pattern in the outer periphery region not only at a stage before chip mounting but also even after chip mounting.

Then, the following technologies are proposed. They are a technology of providing slits in required areas of the solid dummy pattern in the outer periphery region (Patent Document 2 (Japanese Patent Laid-open No. 2005-167141), a technology of making the area ratio of wiring layer in the wiring forming region (the area ratio of wiring patterns to the entire wiring forming region) substantially equal to the area ratio of dummy pattern in the outer periphery region (the area ratio of dummy pattern to the entire outer periphery region), a technology of using the solid dummy pattern and divided dummy patterns in combination (these technologies are described in Patent Document 3 (Japanese Patent Laid-open No. 2008-21921)), and the like.

However, even by using such technologies, it can be said that the problem of the warp of wiring board before and after chip mounting is not sufficiently solved.

SUMMARY OF THE INVENTION

It is an object of the present invention to provide a wiring board and an electronic component device in which it is possible to reduce "warp" that is caused by a thermal expansion coefficient difference between materials and occurs in a wiring board and to perform highly reliable mounting.

The present invention relates to a wiring board including a wiring forming region in which a plurality of wiring layers are stacked while sandwiching insulating layers, and an outer periphery region which is arranged around the wiring forming region and in which reinforcing patterns are formed in the same layers as the wiring layers, in which the area ratio of the reinforcing patterns to the outer periphery region and the area ratio of the wiring layer to the wiring forming region are substantially the same in each of the layers, and the reinforcing patterns exist without a gap in the outer periphery region when the wiring is viewed in planar perspective.

According to the wiring board, reinforcing patterns are provided in the outer periphery region around the wiring forming region in each layer and the area ratio of reinforcing patterns to the outer periphery region and the area ratio of wiring layer to the wiring forming region are substantially the same in each layer, so that rigidity of the entire wiring board is increased, and uneven stress can be eliminated by each layer. Moreover, since the reinforcing patterns exist in the outer periphery region without a gap when the wiring is viewed in planar perspective, rigidity of the entire wiring board can be further increased while eliminating uneven stress. Thus, the warp of wiring board which occurs due to a thermal expansion coefficient difference between materials can be reduced in stages before mounting electronic components on the wiring board, and the warp of wiring board which occurs due to a thermal expansion coefficient difference between materials can be sufficiently reduced when electronic components are finally mounted and covered with resin.

Further, the present invention relates to an electronic component device including the wiring board of the above-described structure and electronic components connected to the uppermost wiring layer of the wiring board.

According to the electronic component device, rigidity of the entire wiring board can be further increased while eliminating uneven stress by using the above-described wiring board. For this reason, even in the case where resin is formed on the entire wiring board to cover electronic components, it is possible to reduce warp that occurs due to a thermal expansion coefficient difference between resin and the wiring board.

DESCRIPTION OF THE PREFERRED EMBODIMENTS

In the following, description will be made for the embodiments of the present invention referring to the attached drawings.

First Embodiment (Wiring Board)

Figure 1:
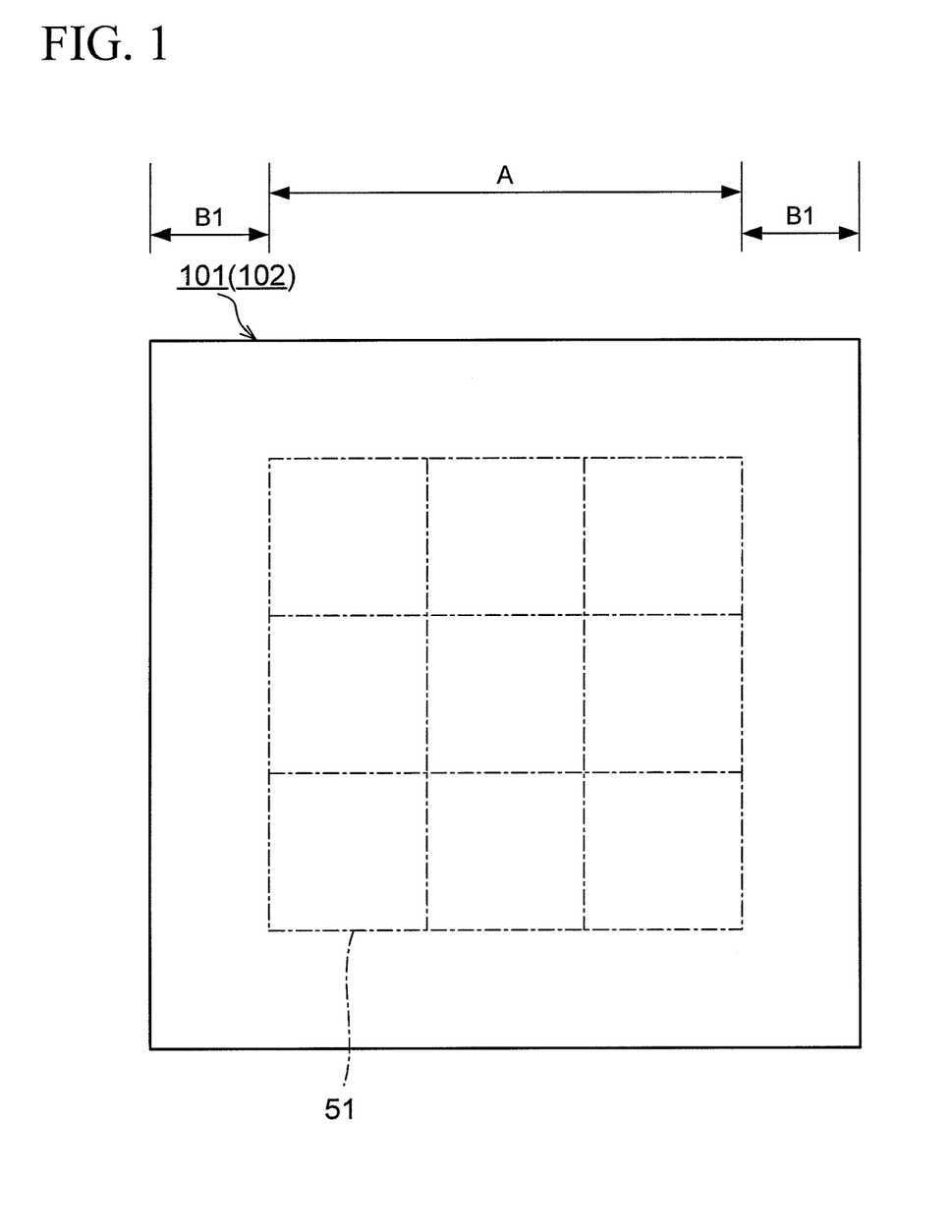
FIG. 1 is a plan view illustrating a wiring board according to first and second embodiments of the present invention.
Figure 7A:
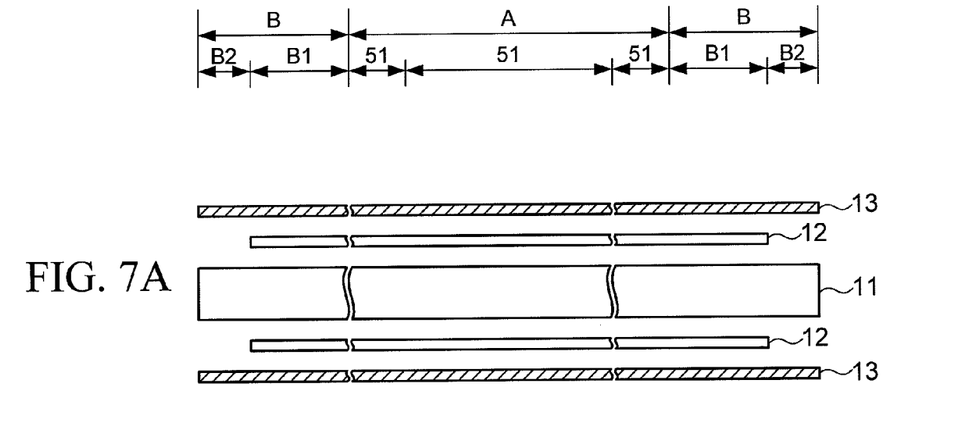
FIGS. 7A to 7K are cross-sectional views illustrating a manufacturing method of a wiring board according to third embodiment of the present invention.
Figure 7B:
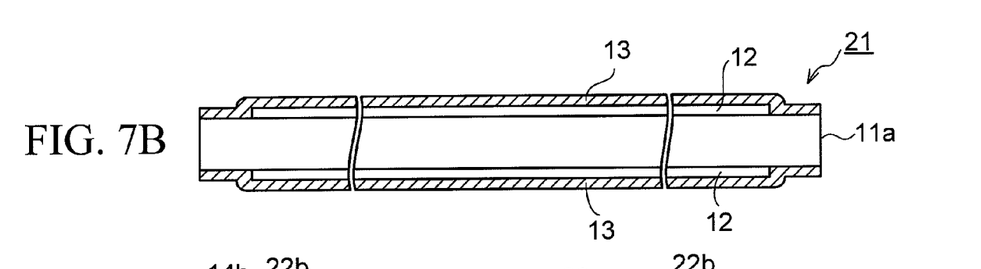
Figure 7C:
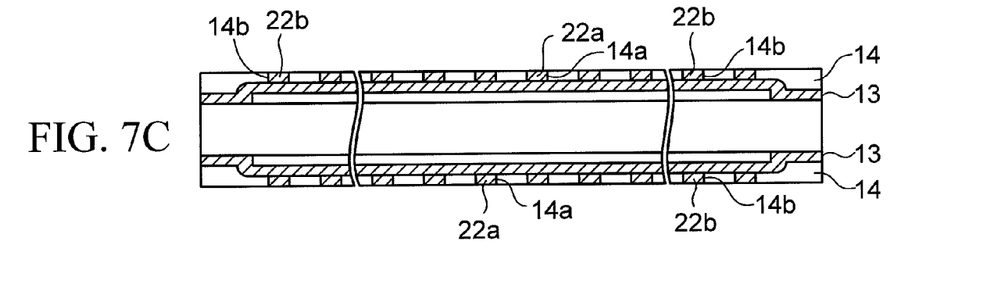
Figure 7D:
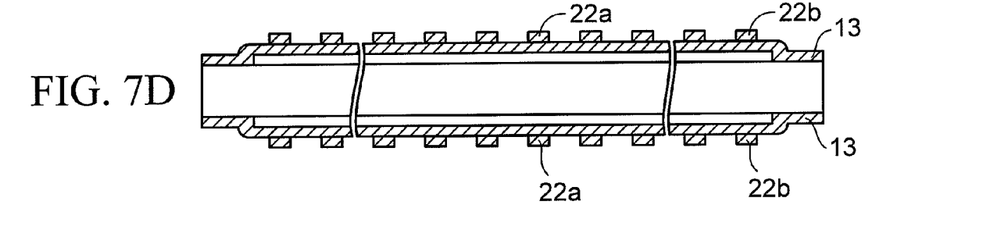
Figure 7E:
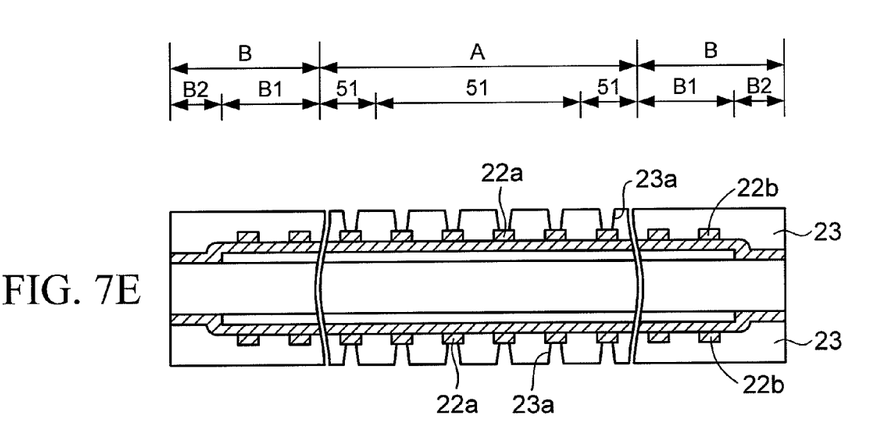
Figure 7F:
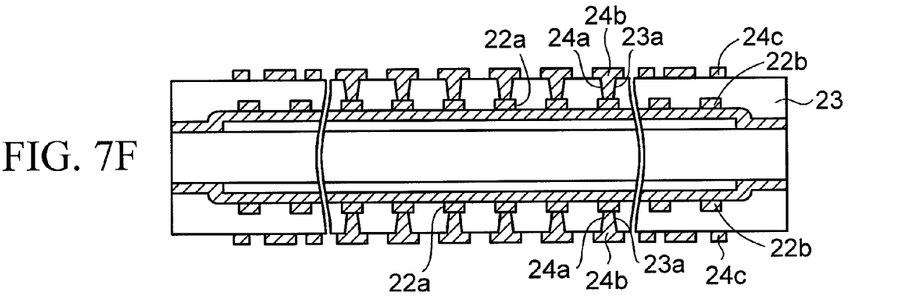
Figure 7G:
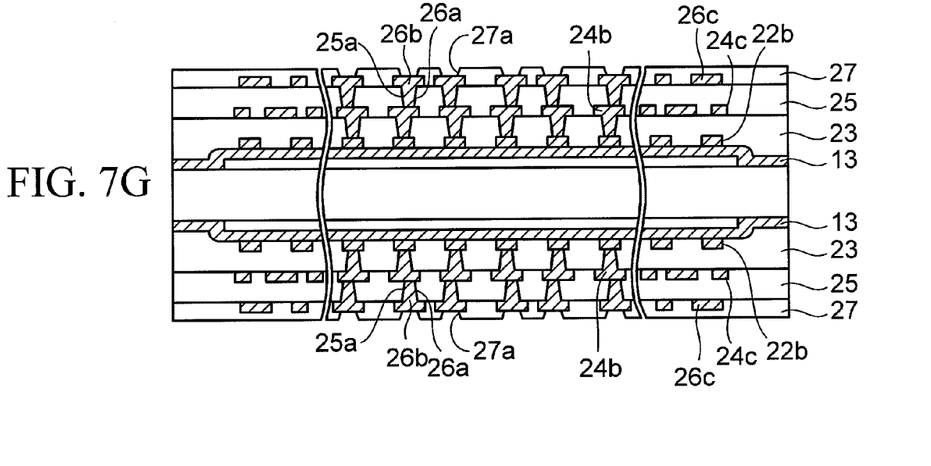
Figure 7H:
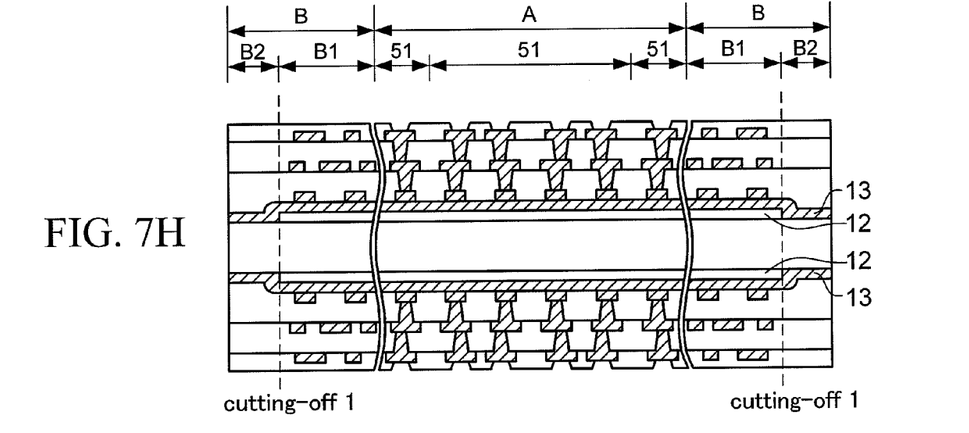
Figure 7I:
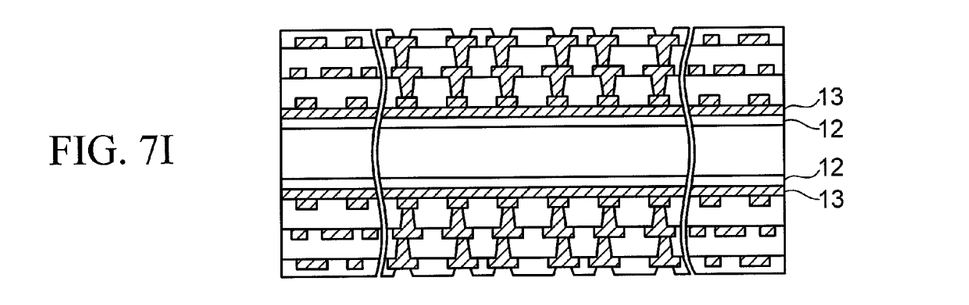
Figure 7J:
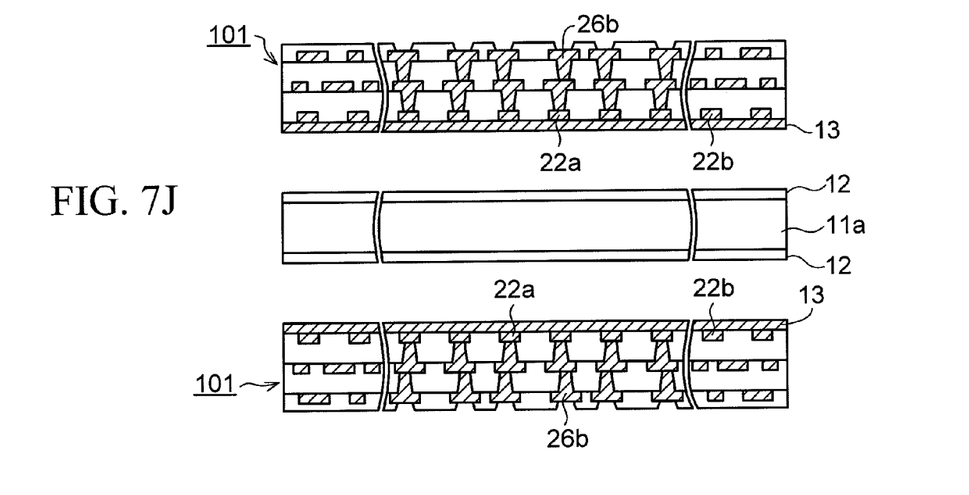
Figure 7K:
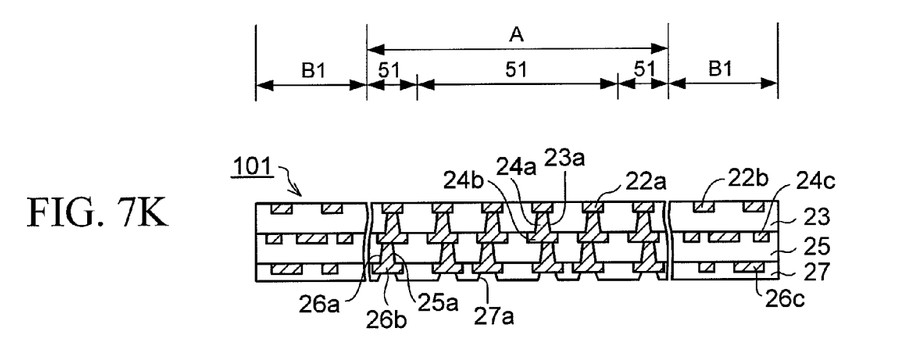

FIG. 1 is the plan view illustrating a wiring board 101 of first embodiment, and FIG. 7K is the cross-sectional view of the wiring board 101 of FIG. 1.

Figure 2A:
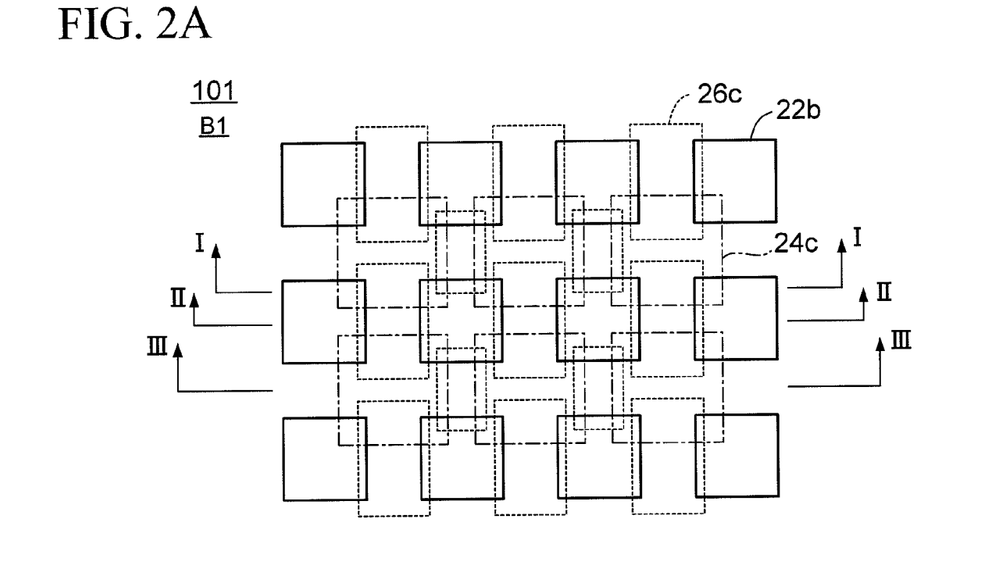
FIG. 2A is a plan view illustrating an aspect where reinforcing patterns of a three-layered structure in an outer periphery region of FIG. 1 is viewed in planar perspective.
Figure 2B:
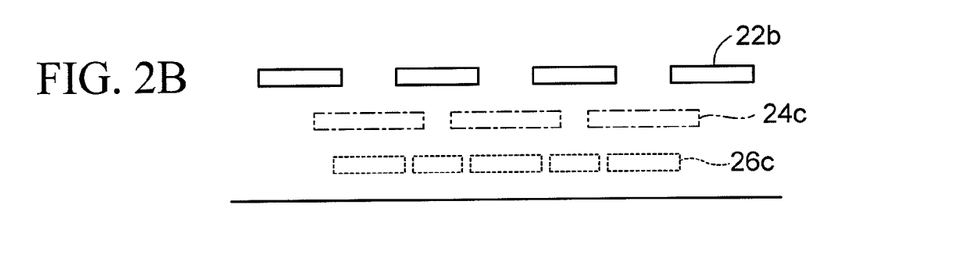
FIG. 2B is a cross-sectional view taken along I-I line of FIG. 2A.
Figure 2C:
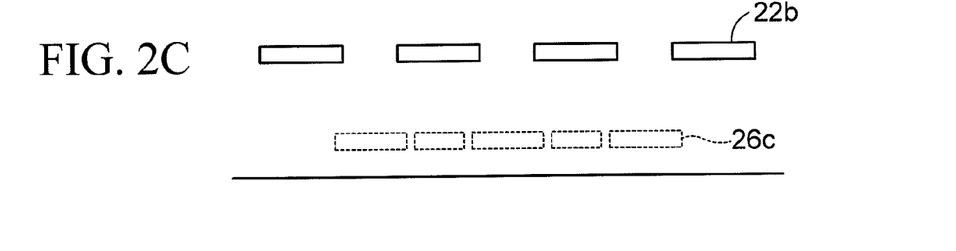
FIG. 2C is a cross-sectional view taken along II-II line of FIG. 2A.
Figure 2D:
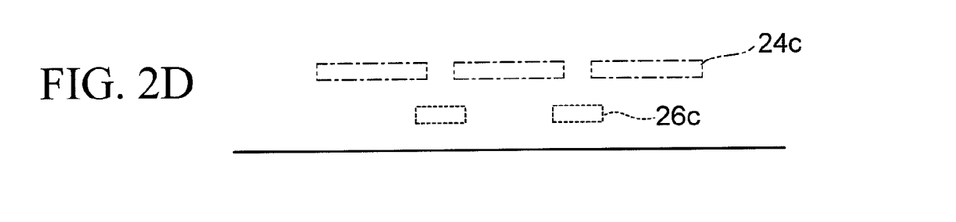
FIG. 2D is a cross-sectional view taken along line of FIG. 2A.

FIGS. 2A to 2D are the views illustrating interlayer arrangement of reinforcing patterns in an outer periphery region, in which FIG. 2A is a plane perspective view, FIG. 2B is a cross-sectional view taken along I-I line of FIG. 2A, FIG. 2C is a cross-sectional view taken along II-II line of FIG. 2A, and FIG. 2D is a cross-sectional view taken along III-III line of FIG. 2A. Note that reinforcing patterns 22b, 24c, 26c are actually repetition patterns, but they are simplified and a part of them are taken out in the examples in FIGS. 2A to 2D.

Figure 3A:
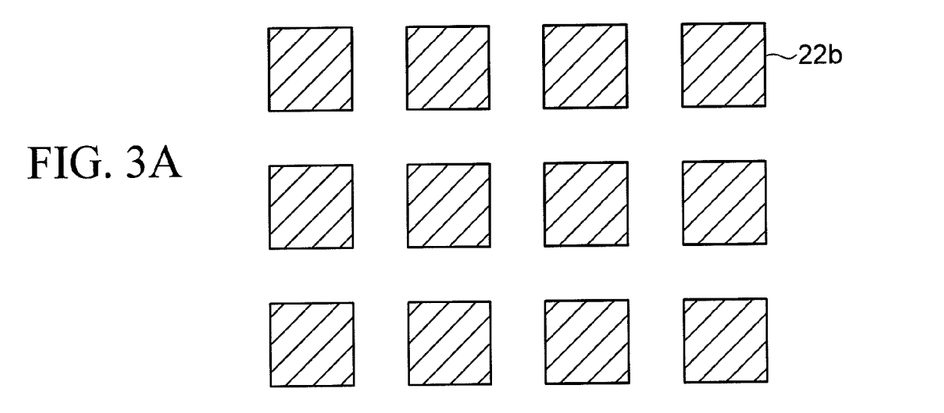
FIG. 3A is a plan view illustrating an arrangement of reinforcing patterns of the first layer from the top in FIG. 2A.
Figure 3B:
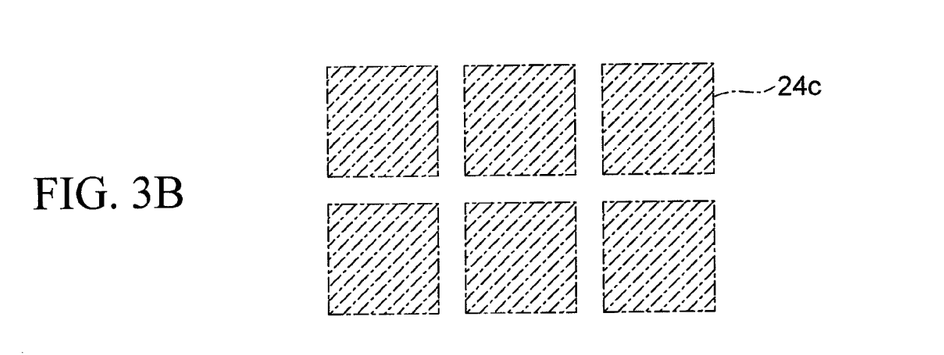
FIG. 3B is a plan view illustrating an arrangement of reinforcing patterns of the second layer from the top in FIG. 2A.
Figure 3C:
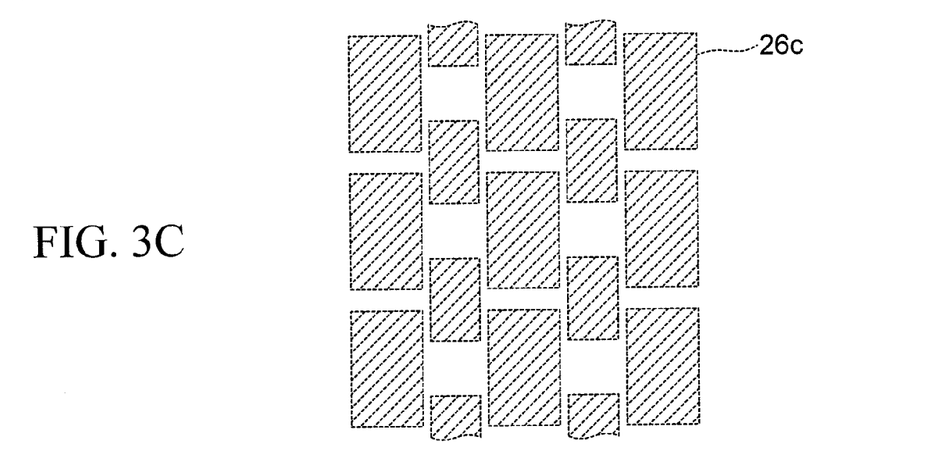
FIG. 3C is a plan view illustrating an arrangement of reinforcing patterns of the lowermost layer in FIG. 2A.

FIGS. 3A to 3C are the plan views illustrating pattern arrangement of the reinforcing patterns which are illustrated in the order from an upper layer to a lower layer. Although the reinforcing patterns 22b, 24c, 26c are repetition patterns in this case as well, they are simplified and a part of them are taken out in the examples in FIGS. 3A to 3C.

The wiring board 101 is in a square flat shape as shown in FIG. 1, and has a wiring forming region A at the central portion and an the outer periphery region B1 that is arranged so as to surround the wiring forming region A. In the wiring forming region A, nine areas in total (three each vertically and horizontally) of chip mounting regions (electronic component mounting regions) 51 are defined, and semiconductor chips can be mounted on each region. One or a plurality of electronic components such as semiconductor chips and chip capacitors can be mounted on the chip mounting regions (electronic component mounting regions) 51.

In the wiring forming region A, three layers of build-up wiring layers and vias connecting wiring layers of adjacent layers are formed.

Specifically, as illustrated in FIG. 7K, the wiring board is constituted of a first wiring layer 22a, a second wiring layer 24b and a third wiring layer 26b sequentially from the upper layer, the wiring layers 22a, 24b, 26b are formed by sandwiching a first insulating layer 23 and a second insulating layer 25 between the layers, respectively, and furthermore, the lowermost third wiring layer 26b is covered with a third insulating layer 27.

First vias 24a are buried in first via holes 23a formed in the first insulating layer 23 to connect the first wiring layer 22a with the second wiring layer 24b. Further, second vias 26a are buried in second via holes 25a formed in the second insulating layer 25 to connect the second wiring layer 24b with the third wiring layer 26b. Further, contact holes 27a are formed in the third insulating layer 27, and the third wiring layer 26b is exposed to a bottom portion of the contact holes 27a.

Each material of the first and second insulating layers 23, 25 in use is epoxy resin, polyimide resin, photosensitive resin or the like, and a material of the third insulating layer 27 in use is solder resist. Further, copper is used as each material of the second and third wiring layers 24b, 26b and the first and second vias 24a, 26a. The first wiring layer 22a is constituted of a two-layered structure of nickel (Ni) film and gold (Au) film sequentially from a lower layer, and the gold film is exposed on the surface. Further, in the third wiring layer 26b, the copper surface is subject to formation of a contact layer (not illustrated) that consists of two layers of nickel (Ni) film contacting copper and gold (Au) film contacting the nickel film, and the gold film is exposed on the surface. The reason why the two-layered structure is used in the first wiring layer 22a and the third wiring layer 26b is that the first wiring layer 22a and the third wiring layer 26b become internal and external connection pads, the nickel (Ni) film interposes for improving adhesiveness between the gold (Au) film and copper, and the gold (Au) film is used for securing wettability of solder or the like or raising adhesiveness with bonding wire.

As illustrated in FIG. 7K, the outer periphery region B1 has a reinforcing structural body formed of the reinforcing patterns 22b, 24c, 26c of the three-layered structure. The reinforcing patterns 22b, 24c, 26c of the three-layered structure are formed by sandwiching the first insulating layer 23 and the second insulating layer 25 between the layers, respectively, and are formed in the same layer as the first to third wiring layers 22a, 24b, 26b and the same material and the same thickness as the first to third wiring layers 22a, 24b, 26b, respectively.

The reinforcing patterns of the three-layered structure are constituted of the first reinforcing pattern 22b, the second reinforcing pattern 24c and the third reinforcing pattern 26c as illustrated in FIGS. 3A to 3C, and as illustrated in FIGS. 2A to 2D, arranged such that the reinforcing patterns 22b, 24c, 26c exist without a gap in the outer periphery region B1 when the wiring board 101 is viewed in planar perspective.

Out of the reinforcing patterns 22b, 24c, 26c of the three-layered structure, in the upper layer, as illustrated in FIG. 3A, the square-shaped first reinforcing patterns 22b (land patterns) are arranged in a grating state in horizontal and vertical directions at an equal gap.

In the middle layer, as illustrated in FIG. 3B, the square-shaped second reinforcing patterns 24c (land patterns) are arranged in a grating state in horizontal and vertical directions at an equal gap. And as illustrated in FIG. 2A, the square-shaped second reinforcing patterns 24c are arranged so as to cover cross-shaped non-forming regions of the first reinforcing patterns 22b, and the cross-shaped non-forming regions are the central portions of assembly regions of four adjacent first reinforcing patterns 22b.

In the lower layer, as illustrated in FIG. 3C, the third reinforcing pattern 26c (discrete land patterns) are regularly arranged in horizontal and vertical directions at an appropriate gap. And as illustrated in FIG. 2A, the third reinforcing pattern 26c are arranged so as to cover regions that are not covered with the first reinforcing patterns 22b and the second reinforcing pattern 24c.

Moreover, in each layer, areas of the reinforcing patterns 22b, 24c, 26c are adjusted such that the area ratio of the reinforcing patterns 22b, 24c, 26c (the area ratio of the reinforcing pattern to the entire first region B1 of the outer periphery region B) and the area ratio of the wiring layers 22a, 24b, 26b (the area ratio of the wiring layer to the entire wiring forming region A) become substantially the same in each layer.

Further, the third insulating layer 27 is formed on the lower surface of the wiring board 101 and protects the wiring layers and the reinforcing patterns. The contact hole 27a for connecting another wiring board with the third wiring layer 26b are formed in the third insulating layer 27.

As described above, according to the wiring board 101 of first embodiment, the reinforcing patterns 22b, 24c, 26c are provided in the outer periphery region B1 of the wiring forming region A in each layer, and the area ratio of the reinforcing patterns 22b, 24c, 26c and the area ratio of the wiring layers 22a, 24b, 26b are substantially the same in each layer, so that rigidity of the entire wiring board 101 is increased and uneven stress can be eliminated by each layer.

Moreover, since the reinforcing patterns 22b, 24c, 26c exist in the outer periphery region B1 without a gap in planar perspective, rigidity of the entire wiring board 101 can be further increased while eliminating uneven stress.

Thus, warp that occurs in the wiring board 101 before chip mounting can be reduced, and thus the wiring board can be easily handled.

(Electronic Component Device)

Next, description will be made for an electronic component device 201 using the above-described wiring board 101 by referring to FIG. 7L.

The electronic component device 201 illustrated in the drawing is constituted by mounting semiconductor chips (electronic components) 32 on the first wiring layer 22a at the top layer of the wiring board 101 via conductive bumps 31 such as a solder bump. The wiring board 101 and the semiconductor chips 32 are covered with a mold resin layer 33. The mold resin layer 33 is made of thermosetting resin such as epoxy resin.

Although the semiconductor chips 32 were exemplified as electronic components, various electronic components such as chip capacitor may be mounted. Further, although the first wiring layer 22a side of the wiring board 101 is used as the mounting surface of electronic components, the third wiring layer 26b side may be used as the mounting surface of electronic components.

As described above, according to the electronic component device 201 of first embodiment, the above-described wiring board 101 to further increase rigidity is used. Accordingly, when the semiconductor chips 32 are finally mounted and covered with the mold resin layer 33, warp occurred in the wiring board 101 can be reduced. Thus, chip crack or the like can be prevented and reliability of chip mounting can be further improved.

Second Embodiment (Wiring Board)

Figure 4A:
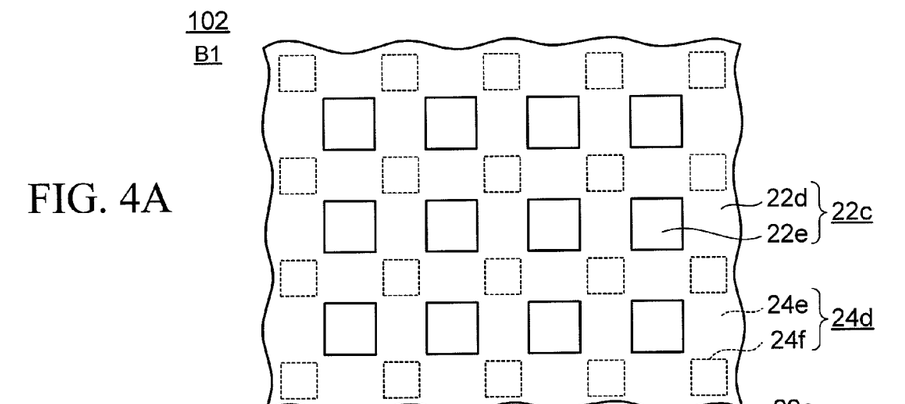
FIG. 4A is a plan view illustrating an aspect where reinforcing patterns of a two-layered structure in the outer periphery region of the wiring board according to second embodiment of the present invention is viewed in planar perspective.
Figure 4B:
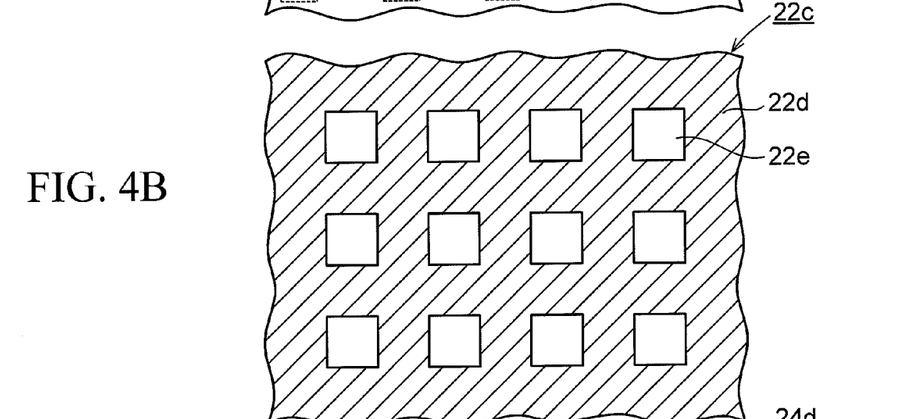
FIG. 4B is a plan view illustrating an arrangement of reinforcing patterns of the first layer from the top in FIG. 4A.
Figure 4C:
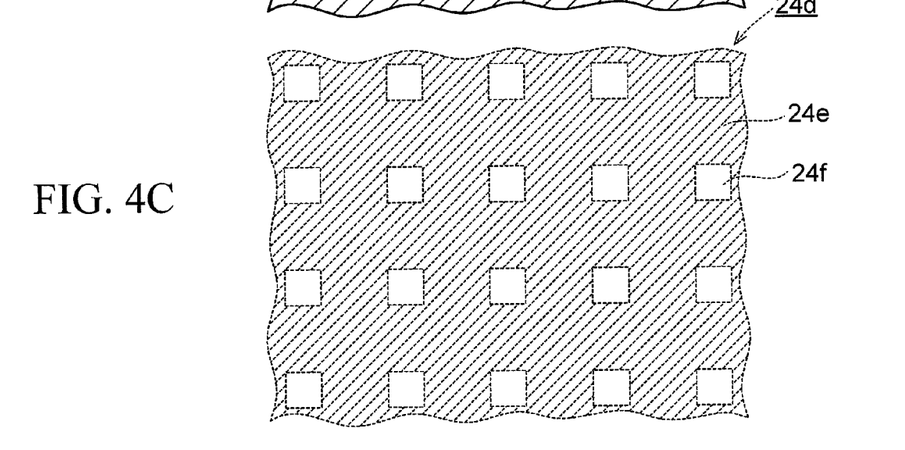
FIG. 4C is a plan view illustrating an arrangement of reinforcing patterns of the lowermost layer in FIG. 4A.

FIG. 4A is the top view illustrating a wiring board 102 of second embodiment. It illustrates an aspect where reinforcing patterns of another constitution, which are formed in the outer periphery region B1 of FIG. 1, is viewed in planar perspective. FIGS. 4B and 4C are the top views illustrating the pattern arrangements of first reinforcing patterns of an upper layer and second reinforcing patterns of a lower layer out of the reinforcing patterns of FIG. 4A, respectively.

In the reinforcing patterns of the wiring board 102 in FIG. 4, the following is what is different from the reinforcing patterns of the wiring board 101 in FIGS. 2 and 3. That is, in FIGS. 2 and 3, the assemblies of land patterns as the reinforcing patterns are used and they are formed in a three-layered structure, whereas in FIG. 4, mesh-shaped reinforcing patterns 22c, 24d are formed in a two-layered structure. Note that reference numerals 22d and 24e denote frame portions, and 22e and 24f denote hole portions in FIGS. 4B and 4C.

Even in the mesh-shaped reinforcing patterns 22c, 24d of FIG. 4, the reinforcing patterns 22c, 24d (frame portions 22d, 24e) are arranged so that the area ratio of the reinforcing patterns 22c, 24d (frame portions 22d, 24e) (the area ratio of reinforcing pattern (frame portion) to the entire first region B1 of the outer periphery region B) and the area ratio of the wiring layers (the area ratio of the wiring layers to the entire wiring forming region A) is substantially the same in each layer, and the reinforcing patterns 22c, 24d exist in the outer periphery region B1 without a gap when the wiring board 102 is viewed in planar perspective.

Therefore, by the wiring board 102 of second embodiment as well, similarly to the wiring board 101 of first embodiment, rigidity of the wiring board 102 against warp is increased while eliminating uneven stress, and thus the warp can be reduced. Therefore, warp that occurs in the wiring board 102 before chip mounting can be reduced. And when chips are finally mounted and covered with resin, warp occurred in the wiring board 102 can be sufficiently reduced. Thus, chip crack or the like can be prevented and reliability of chip mounting can be furthermore improved.

Third Embodiment (Manufacturing Method of Wiring Board)

FIG. 7A to FIG. 7K are the cross-sectional views illustrating the manufacturing method of a wiring board according to third embodiment. Herein, the manufacturing method of a wiring board is applied for fabricating the wiring board 101 of first embodiment, but is also applicable for fabricating the wiring board 102 of second embodiment only by changing the arrangement of reinforcing patterns. In the following description, formation of elements on one side surface of a prepreg 11 is described except for necessary case.

In the manufacturing method of the wiring board 101, as illustrated in FIG. 7B, a temporary board 21 is prepared. In the temporary board 21, the wiring forming region A is defined in the central portion, and in the wiring forming region A, three layers of build-up wiring layers are formed. The outer periphery region B is defined in the periphery so as to surround the wiring forming region A.

In the wiring forming region A, as exemplified in FIG. 1, three each vertically and horizontally, totally nine chip mounting regions 51 are sectioned on the both surfaces of the temporary board 21. Further, the outer periphery region B is further sectioned into the first region B1 in which reinforcing patterns are formed and a second region B2 in the peripheral portion of the first region B1. The second region B2 is removed by cutting when a wiring board is separated from the temporary board 21.

To form the temporary board 21, as illustrated in FIG. 7A, a prepreg 11, two base layers 12, and two copper foils 13 are prepared. The base layer 12 is set to a size equal to the wiring forming region A and the first region B1 of the outer periphery region B, and the copper foil 13 is set to a size equal to the prepreg 11 so as to cover the wiring forming region A and the outer periphery region B.

The prepreg 11 is formed by impregnating thermosetting resin such as epoxy resin in glass cloth (woven cloth), glass non-woven cloth or aramid fiber. The base layer 12 for use is a metal foil such as copper foil having the thickness of 12 to 18 μm, mold release film or mold release agent. The mold release film for use is polyester or PET (polyetyrene terephthalate) film on which thin fluorine resin (ETFE) layer is stacked, or polyester or PET film to the surface of which silicone mold release agent is applied. Further, the mold release agent for use is silicone containing mold release agent or fluorine containing mold release agent.

Then, as illustrated in FIG. 7A, the base layers 12 and the copper foils 13 are laminated on both surfaces of the prepreg 11 in this order from ones closer to the surface. The base layer 12 is arranged corresponding to the wiring forming region A on the prepreg 11, and the copper foils 13 are arranged in the state where the central portions are overlapped on the base layers 12 and their peripheral portions come in contact with the second region B2 of the outer periphery region B of the prepreg 11. The prepreg 11, the base layers 12 and the copper foils 13 are pressurized from both surfaces at the temperature of 190 to 200° C. in vacuum atmosphere. Thus, as illustrated in FIG. 7B, the prepreg 11 is cured to obtain a base 11a made of glass epoxy resin or the like, and the base layers 12 and the copper foils 13 are adhered to the both surfaces of the base 11a with the curing of the prepreg 11. The entire base layer 12 is adhered to the wiring forming region A of the base 11a, and the peripheral portion of the copper foil 13 is partially adhered to the second region B2 of the outer periphery region B of the base 11a. In the wiring forming region A and the first region B1 of the outer periphery region B, the base layer 12 and the copper foil 13 are overlapped. The both are in a simply contacted state, and thus, as described later, the base layer 12 and the copper foil 13 can be easily separated in the region.

Meanwhile, in the case where mold release agent is used as the base layer 12, the mold release agent is formed by coating or spraying it at the center on adhering surface side of the prepreg 11 with the copper foil 13 so as to serve as the base layer 12. The copper foil 13 is arranged on the prepreg 11 via the mold release agent, and adhered by heating/pressurizing it. Thus, the temporary board 21 illustrated in FIG. 7B is completed.

Next, as illustrated in FIG. 7C, plating resist films 14 are formed on the both surfaces of the temporary board 21, and the plating resist films 14 are provided with opening portions 14a, 14b at required positions. Gold (Au) film and nickel (Ni) film are formed inside the opening portions 14a, 14b of the plating resist film 14 by electrolytic plating from the temporary board 21 side. With this, the first wiring layer 22a of a two-layered structure is formed inside the opening portions 14a of the wiring forming region A, and the first reinforcing pattern 22b is formed inside the opening portions 14b of the first region B1 of the outer periphery region B. At this point, the first reinforcing pattern 22b is planned to be formed at the same thickness and the same area ratio as the first wiring layer 22a. In this case, a mask for forming the opening portions 14a, 14b of the plating resist film 14 is fabricated while intending to allow the area ratio of the first wiring layer 22a in the wiring forming region A and the area ratio of the first reinforcing pattern 22b in the first region B1 to be the same. Even in such case, when the opening portions 14a, 14b of the plating resist film 14 are formed using the mask, it is actually difficult to make the area ratio be completely the same due to varied mask dimensions, manufacturing variation in photolithography process, or the like. When the area ratio of the first wiring layer 22a and the area ratio of the first reinforcing patterns 22b fall within the variation range of 5 to 6%, more preferably 2%, the area ratio can be regarded as the same. The same applies to the second layer and the third layer to be described below.

After that, as illustrated in FIG. 7D, the plating resist film 14 is removed.

Next, as illustrated in FIG. 7E, the first insulating layers 23 are formed on the both surfaces of the temporary board 21, and the first insulating layer 23 covers the first wiring layer 22a and the first reinforcing pattern 22b. A material of the first insulating layer 23 in use is epoxy resin, polyimide resin or the like. In an example of the forming method of the first insulating layer 23, after a resin film is laminated on the temporary board 21, the resin film is thermally treated and cured at the temperature of 130 to 150° C. while it is pressed (pressing). Thus, the first insulating layers 23 are obtained.

Next, in the wiring forming region A, the first insulating layer 23 is processed by laser or the like so as to expose the first wiring layer 22a of the temporary board 21, and thus first via holes 23a reaching the first wiring layer 22a are formed.

Note that the first insulating layer 23 having the first via holes 23a may be formed by patterning a photosensitive resin film by photolithography, or may be formed by screen-printing a resin film having the opening portions 23a.

Next, as shown in FIG. 7F, in the wiring forming region A, first vias 24a made of copper (Cu), which are connected to the first wiring layer 22a, and the second wiring layer 24b connected to the first vias 24a are continuously formed in the first via holes 23a and on the first insulating layer 23. By the same process, in the first region B1 of the outer periphery region B, the second reinforcing pattern 24c is formed on the first insulating layer 23. The first vias 24a, the second wiring layer 24b and the second reinforcing pattern 24c are formed by a semi-additive method, for example.

Description will be made in detail for the semi-additive method. First, a Cu seed layer (not illustrated) is formed in the first via holes 23a and on the first insulating layer 23 by an electroless plating method or a sputtering method, and then it is followed by forming a resist film (not shown) having opening portions corresponding to the second wiring layer 24b and the second reinforcing pattern 24c. At this point, forming the second reinforcing pattern 24c at the same thickness and the same area ratio as the second wiring layer 24b is preferable in a copper plating method in which plating is performed via the opening portions of the resist film. Because, the applied way of copper plating to the Cu seed layer does not become uneven.

Subsequently, by an electrolytic plating method, Cu layer patterns (not illustrated) are formed on the opening portions of the resist film. In the electrolytic plating method, the Cu seed layer is utilized for a plating feed layer Next, after removing the resist film, the Cu seed layer is etched while using the Cu layer pattern as a mask to obtain the first vias 24a, the second wiring layer 24b and the second reinforcing pattern 24c. Note that as adoptable forming methods of them, there are various wiring forming methods such as a subtractive method other than the above-described semi-additive method.

Processes similar to FIGS. 7E and 7F is repeated after forming the first vias 24a, the second wiring layer 24b and the second reinforcing pattern 24c in this manner. As a result, in the wiring forming region A, second vias 26a and the third wiring layer 26b are formed in the second via holes 25a of the second insulating layer 25 and on the second insulating layer 25 as illustrated in FIG. 7G, respectively. The third wiring layer 26b is connected to the second wiring layer 24b via the second vias 26a. By the same process, in the first region B1 of the outer periphery region B, the third reinforcing pattern 26c is formed on the second insulating layer 25 at the same material, the same thickness and the same area ratio as the third wiring layer 26b.

Next, as illustrated in FIG. 7G, the third insulating layer 27 made of solder resist is formed. In the third insulating layer 27, opening portions (contact holes) 27a are provided on the third wiring layer 26b. Thus, area of the third wiring layer 26b, which is exposed inside the opening portions 27a of the third insulating layer 27, becomes external connection pad connected to another wiring board or the like. Subsequently, a contact layer (not illustrated) such as an Ni/Au plated layer is formed on the third wiring layer 26b inside the opening portions 27a of the third insulating layer 27. Consequently, three layers of build-up wiring layers (the first to third wiring layers 22a, 24b, 26b) are formed on the both surfaces of the temporary board 21. In the above-described example, the three layers of build-up wiring layers are formed, but p-layers (n is an integer of 2 or 4 or more) of build-up wiring layers may be formed.

Next, as illustrated in FIG. 7H, an area corresponding to the second region B2 of the outer periphery region B is removed by cutting (cutting off 1). Thus, as illustrated in FIG. 7I, the wiring forming region A and the first region B1 of the outer periphery region B in which the base layers 12 simply come into contact with the copper foils 13 is obtained, and as illustrated in FIG. 7J, the base layers 12 and the copper foils 13 can be easily separated. Thus, two wiring boards 101 where the copper foils 13 are attached to one sides thereof, respectively, are obtained.

Next, the copper foils 13 are selectively etched and removed. In this case, the materials exposed outside the first wiring layer 22a and the third wiring layer 26b of the build-up wiring layer are gold (Au), and therefore, it is possible to selectively etch the copper foil 13 made of copper (Cu) to gold (Au).

Next, as shown in FIG. 7K, for example, the wiring board 101 that was fabricated on the upper side of the temporary board 21 is vertically inverted to allow the first wiring layer 22a to face upward. Thus, the first wiring layer 22a, which is exposed from the first insulating layer 23, become internal connection pads connected to electronic components. Meanwhile, the wiring board 101 is vertically inverted to allow the side of the first wiring layer 22a to be the mounting surface of electronic components, but the side of the third wiring layer 26b may be used as the mounting surface of electronic components without vertically inverting.

The coreless wiring board 101 is completed in this manner.

As described above, according to the manufacturing method of a wiring board of third embodiment, when the first to third wiring layers 22a, 24b, 26b are formed in the wiring forming region A, the first to third reinforcing patterns 22b, 24c, 26c can be formed by the same process in the same layer as the first to third wiring layers 22a, 24b, 26b in the first region B1 of the outer periphery region B of the wiring forming region A at the same material, the same thickness and the same area ratio as the first to third wiring layers 22a, 24b, 26b. Accordingly, the wiring board 101 capable of reducing warp, which occurs due to a thermal expansion coefficient difference between materials, can be easily manufactured without drastically changing a process or manufacture conditions.

Fourth Embodiment (Manufacturing Method of Electronic Component Device)

Next, referring to FIG. 7L, description will be made for a manufacturing method of an electronic component device according to fourth embodiment.

Figures 7L, 7M:
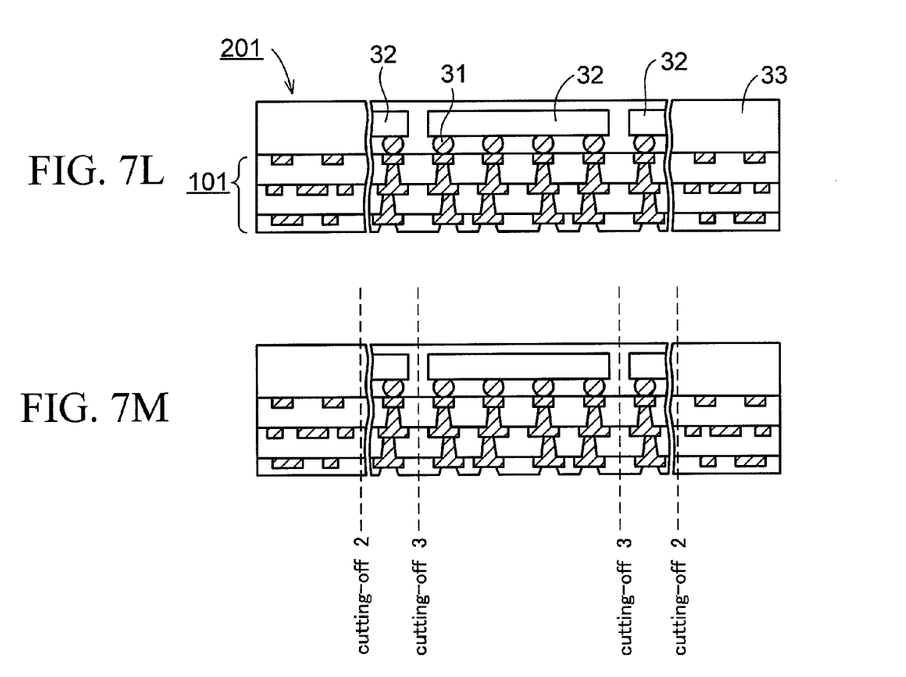
FIG. 7L is a cross-sectional view illustrating a manufacturing method of an electronic component device according to fourth embodiment.
FIGS. 7M and 7N are cross-sectional views illustrating a manufacturing method of one electronic component device mounting an electronic component thereon from the electronic component device of FIG. 7L.
Figure 7N:
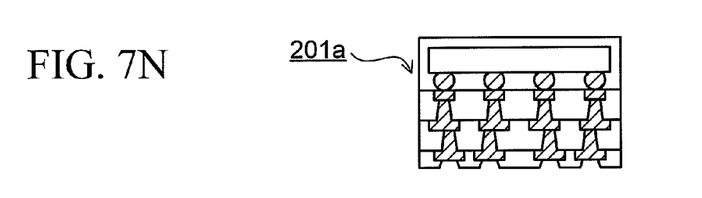

FIG. 7L is the cross-sectional view illustrating the manufacturing method of an electronic component device 201 using the above-described wiring board 101. Note that FIGS. 7M and 7N are the cross-sectional views illustrating the method of fabricating an electronic component device mounting electronic components thereon by separating a plurality of the electronic component devices 201 mounting electronic components after the electronic component devices 201 are completed.

In the manufacturing method of the electronic component device, the wiring board 101 of FIG. 7K and semiconductor chips (electronic components) 32 equipped with bumps 31 are prepared first.

Next, as illustrated in FIG. 7L, the bumps 31 of the semiconductor chips 32 are flip-chip connected to the first wiring layer 22a at the top layer of the wiring board 101.

Next, thermosetting resin made of liquid state epoxy resin or the like is formed on the entire wiring board 101 so as to cover the semiconductor chips 32. For example, the wiring board 101 is placed into a mold, and thermosetting resin is injected into the mold to shape it.

Once the thermosetting resin is sufficiently filled into gaps between the wiring board 101 and the semiconductor chips 32, the thermosetting resin is cured by heating, and then cooled down. Consequently, a mold resin layer 33 is formed on the entire wiring board 101 so as to cover the semiconductor chips 32, and the electronic component device 201 mounting nine semiconductor chips 32 thereon is completed. Meanwhile, after performing flip-chip connection of the semiconductor chips 32 to the wiring board 101, underfill resin may be filled between the semiconductor chips 32 and the wiring board 101 before covering with the thermosetting resin as the mold resin layer 33.

In the electronic component device 201, as illustrated in FIG. 7M, the first region B1 of the outer periphery region B in which the reinforcing patterns are formed is cut and removed (cutting off 2) later, and then wiring board is cut off (cutting off 3) and separated corresponding to each semiconductor chip 32. As a result, nine in total of electronic component devices 201a in which one semiconductor chip 32 is mounted on a wiring board are fabricated as illustrated in FIG. 7N.

Meanwhile, adoptable mounting methods of electronic components are various mounting methods such as a wire bonding method other than the flip-chip mounting.

As described above, according to the manufacturing method of an electronic component device according to fourth embodiment, the above-described wiring board 101 whose rigidity is increased is used. Thus, when thermal treatment is performed after the semiconductor chips 32 are mounted on the wiring board 101 and the semiconductor chips 32 is covered with the thermosetting resin, it is possible to reduce warp which occurrs in the wiring board 101 due to a thermal expansion coefficient difference between materials. Thus, chip crack or the like can be prevented, and reliability of chip mounting can be further improved.

EXAMPLE

Table 1 is an example of the present invention, and it is an example of a wiring board that has four wiring layers which are 1 layer more than those of FIG. 2 and FIG. 3 and is provided with reinforcing patterns made up of land patterns of a four-layered structure corresponding to the number of wiring layers. The wiring board can be fabricated by repeating processes similar to FIGS. 7E to 7F with respect to FIG. 7G. In this case, the area ratio of the reinforcing patterns in the frame area (the outer periphery region B1) and the area ratio of the wiring layers in the product area (the wiring forming region A) are made substantially the same in each layer, the pattern arrangement is similar to that of FIG. 2, and the reinforcing patterns are arranged so as to exist in the outer periphery region B1 without a gap when the wiring board is viewed in planar perspective.

TABLE 1

The area ratio of wiring layers and that of reinforcing patterns in four-layer product (Example of the land patterns of the present invention)

|  | Product area | Frame area |
| --- | --- | --- |
| First layer | 58% | 58% |
| Second layer | 83% | 83% |
| Third layer | 89% | 89% |
| Fourth layer | 63% | 63% |

Figure 8A:
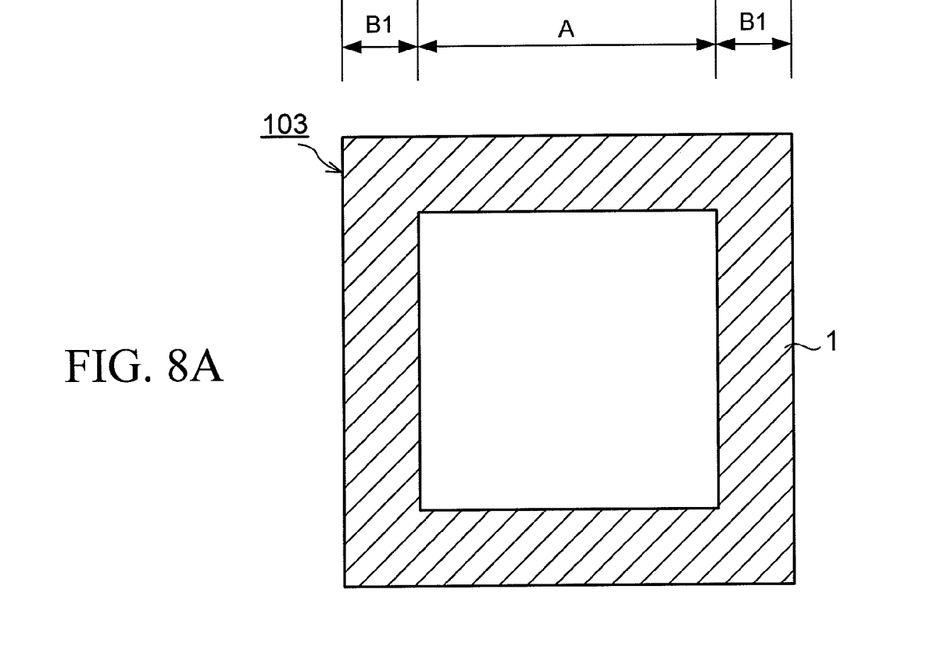
FIGS. 8A and 8B are cross-sectional views illustrating a wiring board according to a comparative example.
Figure 8B:
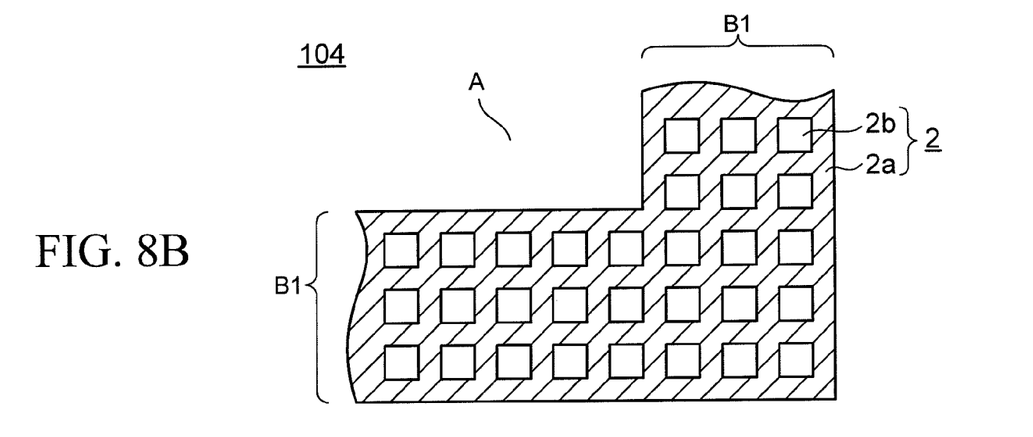

On the other hand, Table 2 and Table 3 are comparative examples of wiring boards 103, 104 provided with the reinforcing patterns of four-layered structure in the same manner as the case of Table 1. They are examples where the area ratio of the reinforcing patterns in the frame area (the outer periphery region B1) and the area ratio of the wiring layers in the product area (the wiring forming region A) were not set to the same ratio in each layer. Further, unlike the case of Table 1, the solid reinforcing pattern 1 illustrated in FIG. 8A was used in Table 2, and the mesh-shaped reinforcing pattern 2 illustrated in FIG. 8B was used in Table 3. Note that FIG. 8B is an enlarged plan view of the wiring board 104, and in the mesh-shaped reinforcing pattern 2, reference numeral 2a denotes a frame portion and 2b denotes hole portions.

TABLE 2

The area ratio of wiring layers and that of reinforcing patterns in four-layer product (Example of the solid pattern of the comparative example)

|  | Product area | Frame area |
| --- | --- | --- |
| First layer | 58% | 100% |
| Second layer | 83% | 100% |
| Third layer | 89% | 100% |
| Fourth layer | 63% | 100% |

TABLE 3

The area ratio of wiring layers and that of reinforcing patterns in four-layer product (Example of the mesh pattern of the comparative example)

|  | Product area | Frame area |
| --- | --- | --- |
| First layer | 58% | 85% |
| Second layer | 83% | 85% |
| Third layer | 89% | 85% |
| Fourth layer | 63% | 85% |

Figure 9A:
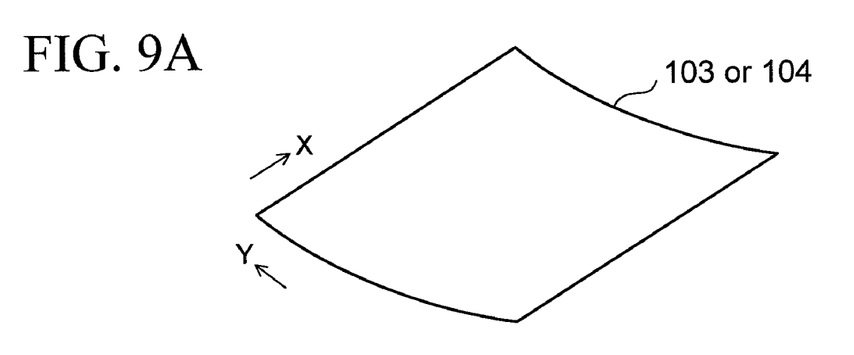
FIGS. 9A and 9B are perspective views illustrating an example of warp that occurs in the wiring board according to the comparative example of FIGS. 8A and 8B.
Figure 9B:
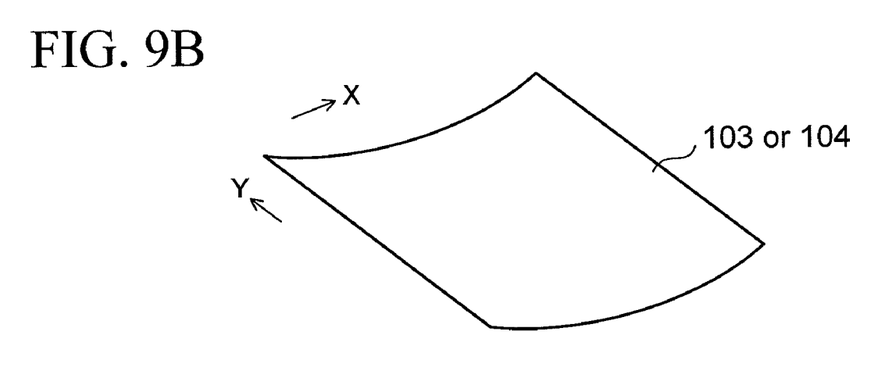

When strength to warp is compared, in the case of the wiring boards 103, 104 of Table 2 and Table 3, even if the reinforcing patterns are arranged so as to exist in the outer periphery region B1 without a gap when the wiring is viewed in planar perspective or even if not so, strength against warp reduced comparing to the case of the wiring board of Table 1, and it was found out that the warp as illustrated in FIG. 9A or FIG. 9B occurred in wiring boards 103, 104 by the heating treatment in the manufacturing process of the wiring boards 103, 104 or the manufacturing process of an electronic component device using the wiring boards 103, 104. More specifically, it was confirmed that the reinforcing patterns having the constitution of the present invention had the best strength against warp.

Modification Example of Embodiment

Although the present invention has been described in detail based on the embodiments, the scope of the invention is not limited to the examples specifically shown in the above-described embodiments, and modifications of the above-described embodiments in a scope without departing from the gist of the invention are included in the scope of the invention.

For example, in the above-described embodiments, the reinforcing patterns of a three-layered structure or two-layered structure are formed in the outer periphery region B1 corresponding to the number of wiring layers in the wiring board 101 of FIG. 2 or the wiring board 102 of FIG. 4. In the example of Table 1, the reinforcing patterns of four-layered structure are formed. However, if the number of wiring layers is increased to five layers or more, reinforcing patterns having the structure of five layers or more may be formed corresponding to the increased number. In this case as well, the reinforcing patterns can be arranged such that the area ratio of the reinforcing patterns and the area ratio of the wiring layers become substantially the same in each layer, and furthermore, the reinforcing patterns exist in the outer periphery region without a gap in planar perspective.

Further, as illustrated in FIG. 1 and FIG. 7C to FIG. 7J, on the both surfaces of the temporary board 21, the wiring forming region A is sectioned into nine chip mounting regions 51, but it may be one each or may be sectioned into a plurality other than of the chip mounting regions 51 on the both surfaces of the temporary board 21, or may be one or sectioned into a plurality of chip mounting regions 51 on one side of the temporary board 21.

Further, as illustrated in FIGS. 7A and 7B, although the base layers 12 and the copper foils 13 are formed on the prepreg 11, and they are thermally treated to fabricate the temporary board 21, a copper board itself may be used as the temporary board 21. In this case, to separate the wiring board from the temporary board 21, the second region B2 of the outer periphery region B may not be provided. The copper board may only be removed by direct etching.

Further, in the above-described embodiments, the present invention is applied to an electronic component device in which the wiring board 101 and the semiconductor chips 32 are covered with the mold resin layer 33 made of thermosetting resin. However, it is also effective to apply the present invention to an electronic component device in which underfill resin is filled in gaps between the wiring board 101 and the semiconductor chips 32 in addition to the mold resin layer 33, and furthermore, it is also effective to apply the present invention to an electronic component device in which only underfill resin is filled without providing the mold resin layer 33.

Figure 5:
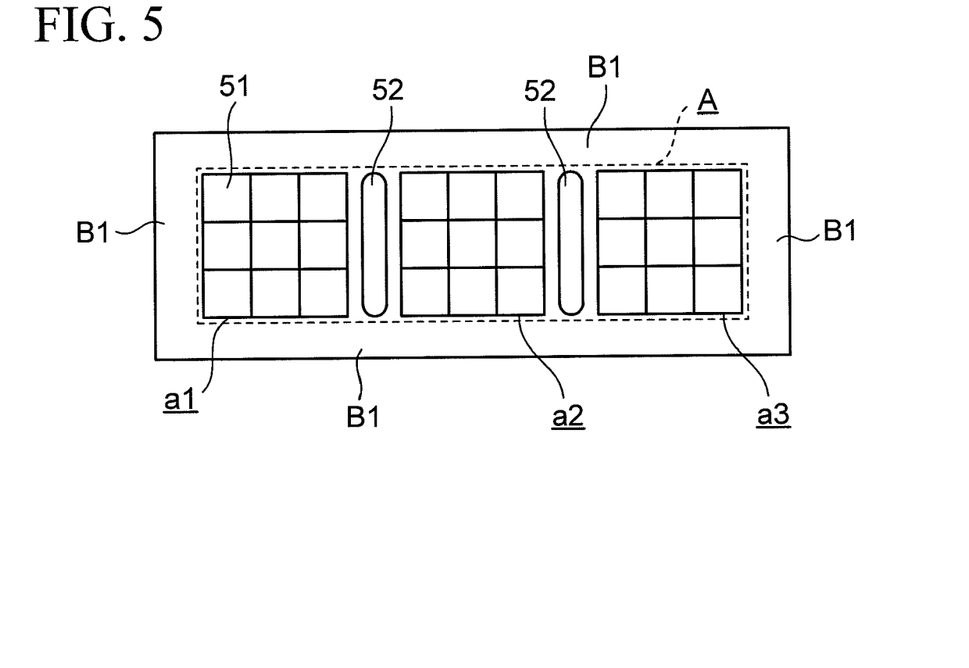
FIG. 5 is a plan view illustrating a modification example of the wiring board according to First and second embodiments of the present invention.

Further, in the above-described embodiments, the wiring forming region A surrounded by the peripheral first region B1 has the wiring forming region where nine chip mounting regions (electronic component mounting regions) 51 are assembled as illustrated in FIG. 1. But, the wiring forming region A may have a plurality of wiring forming regions where nine chip mounting regions (electronic component mounting regions) 51 are assembled. The case of three (the wiring forming regions a1, a2, a3), for example, is illustrated in FIG. 5. Note that opening portions 52 pierced through the wiring board are provided between each wiring forming region a1, a2, a3 in order to absorb expansion and contraction of the wiring board due to thermal expansion or the like.

Further, in the case of FIG. 5, reinforcing patterns similar to FIG. 2 to FIG. 4 may be also arranged around each wiring forming region a1, a2, a3. In this case, it is preferable that the area ratio of the reinforcing patterns around each wiring forming region a1, a2, a3 is the same as the area ratio of the wiring layers in corresponding each wiring forming region a1, a2, a3, and the area ratio of the reinforcing patterns in the first region B1 is the same as an area ratio that is obtained by totalizing the area ratio of the wiring layers and that of the reinforcing patterns inside the wiring forming region A.

Figure 6:
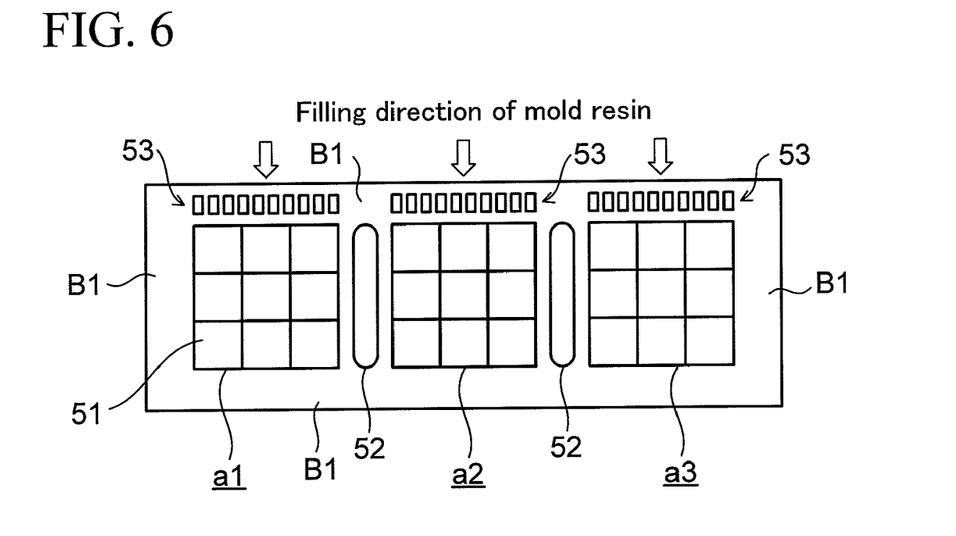
FIG. 6 is a plan view illustrating another modification example of the wiring board according to first and second embodiments of the present invention.

Further, in the above-described embodiments, reinforcing patterns having the same shape are provided in the same arrangement in the peripheral first region B1. However, in the case where the reinforcing patterns are arranged too densely and injection of resin is blocked when the board is placed in a mold and the resin is injected in order to form the mold resin layer, slit-shaped reinforcing patterns 53 as mold gates may be provided along the filling direction of mold resin instead of the densely arranged reinforcing patterns in a part of the outer periphery region B1 in order to prevent injection of resin from being blocked, as illustrated in FIG. 6.

What is claimed is:

1. A wiring board comprising:
   a wiring forming region in which a plurality of wiring layers are stacked while sandwiching insulating layers; and
   an outer periphery region which is arranged around the wiring forming region and in which a reinforcing pattern is formed in the same layer as each of the wiring layers, wherein
   the area ratio of the reinforcing pattern to the outer periphery region and the area ratio of the wiring layer to the wiring forming region are substantially the same in each of the layers, and the reinforcing patterns exist without a gap in the outer periphery region when the wiring board is viewed in planar perspective.

2. The wiring board according to claim 1, wherein the reinforcing pattern is formed of the same material and in the same thickness as the wiring layer.

3. The wiring board according to claim 1, wherein the reinforcing pattern is a pattern on which a plurality of land patterns are arranged, or a mesh pattern.

4. The wiring board according to claim 1, wherein a plurality of electronic component mounting regions are defined in the wiring forming region of the wiring board.

5. An electronic component device comprising:
   a wiring board including
      a wiring forming region in which a plurality of wiring layers are stacked while sandwiching insulating layers, and
   an outer periphery region which is arranged around the wiring forming region and in which a reinforcing pattern is formed in the same layer as each of the wiring layers, wherein
   the area ratio of the reinforcing pattern to the outer periphery region and the area ratio of the wiring layer to the wiring forming region are substantially the same in each of the layers, and the reinforcing patterns exist without a gap in the outer periphery region when the wiring board is viewed in planar perspective; and
   an electronic component connected to the outermost wiring layer of the wiring board.

6. The electronic component device according to claim 5, wherein the wiring board is covered with thermosetting resin so as to cover the electronic component.

* * * * *